United States Patent
Jang

(10) Patent No.: US 8,546,858 B2
(45) Date of Patent: Oct. 1, 2013

(54) SEMICONDUCTOR DEVICE AND METHOD FOR MANUFACTURING THE SAME

(75) Inventor: Kyoung Chul Jang, Seongnam (KR)

(73) Assignee: Hynix Semiconductor Inc., Icheon (KR)

( * ) Notice: Subject to any disclaimer, the term of this patent is extended or adjusted under 35 U.S.C. 154(b) by 0 days.

(21) Appl. No.: 13/597,137

(22) Filed: Aug. 28, 2012

(65) Prior Publication Data

US 2012/0319195 A1 Dec. 20, 2012

Related U.S. Application Data

(62) Division of application No. 12/848,045, filed on Jul. 30, 2010, now Pat. No. 8,278,201.

(30) Foreign Application Priority Data

Jan. 25, 2010 (KR) ........................ 10-2010-0006524

(51) Int. Cl.
*H01L 29/76* (2006.01)

(52) U.S. Cl.
USPC ........................................ 257/288

(58) Field of Classification Search
None
See application file for complete search history.

(56) References Cited

U.S. PATENT DOCUMENTS 7,129,132 B2 * 10/2006 Tanaka et al. ................. 438/244
7,319,255 B2 * 1/2008 Hwang et al. ................. 257/330

FOREIGN PATENT DOCUMENTS

KR 10-2009-0076028 A 7/2009

OTHER PUBLICATIONS

K. Choi et al., "Growth Mechanism of ALD-TiN and the Thickness Dependence of Work Function", 2005, pp. 103-104, IEEE.
K. Choi et al., "The Effect of Metal Thickness, Overlayer and High-k Surface Treatment on the Effective Work Function of Metal Electrode", Proceedings of ESSDERC, 2005, pp. 101-104, IEEE.
R. Singanamalla et al., "On the Impact of TiN Film Thickness Variations on the Effective Work Function of Poly-Si/TiN/SiO2 and Poly-Si/TiN/HfSiON Gate Stacks", IEEE Electron Device Letters, May 2006, pp. 332-334, vol. 27, No. 5, IEEE.

* cited by examiner

*Primary Examiner* — Scott B Geyer

(57) ABSTRACT

The present invention relates to a semiconductor device and a method for manufacturing the same. According to the present invention, a method of manufacturing a semiconductor device includes: forming a recess on a semiconductor substrate; forming a first gate electrode material and a hard mask layer on an entire surface including the recess; etching the hard mask layer and the first gate electrode material to form the first gate electrode pattern on a lower portion of inside of the recess; forming a second gate electrode material on an entire surface including the recess; and etching the second gate electrode material and separating the second gate electrode material.

2 Claims, 5 Drawing Sheets

SEMICONDUCTOR DEVICE AND METHOD FOR MANUFACTURING THE SAME

CROSS-REFERENCES TO RELATED APPLICATIONS

The present application is a division of U.S. patent application Ser. No. 12/848,045, filed on Jul. 30, 2010, which claims priority to Korean patent application number 10-2010-0006524, filed on Jan. 25, 2010, which are incorporated by reference in their entirety.

BACKGROUND OF THE INVENTION

The present invention relates to a semiconductor device and a method for manufacturing the same.

A semiconductor memory devices is constructed of a plurality of unit cells, each including one capacitor and one transistor. The capacitor is used to temporarily store data. The transistor is used to transfer data between a bit line and the capacitor according to a control signal using the characteristics of a semiconductor changing an electric conductivity according to an environment. The transistor is composed of three regions including a gate, a source, and a drain. Charge transfer occurs between the source and the drain according to a control signal input to the gate. The charge transfer between the source and the drain is achieved through a channel region using the characteristics of the semiconductor.

When a transistor is manufactured on a semiconductor substrate, a gate is formed on the semiconductor substrate, then impurities are doped on both sides of the gate to form a source and a drain.

As a data storage capacity of the semiconductor memory device is increased and the semiconductor memory device becomes highly integrated, there is a need to reduce the size of unit cells. Namely, since a design rule of the capacitor and the transistor included in the unit cell is decreased, and accordingly a channel length of a cell transistor is gradually reduced, a short channel effect and Drain Induced Barrier Lower (DIBL) occurs in a general transistor to thereby deteriorate the reliability of an operation. These phenomena occurring due to a reduction in channel length can be solved by maintaining a threshold voltage so that the cell transistor may perform a normal operation. In general, the shorter the channel of the transistor is, the larger a doping density of impurities in a channel formation region is.

However, when the design rule is reduced to less than 100 nm, doping densities in a channel formation region is increased by as much as this. This increases an electric field in a storage node (SN) junction to thereby deteriorate a refresh characteristic of the semiconductor memory device as the occurrence of another problem. To solve the problem, a cell transistor having a 3-dimensional channel structure is used in which a channel is formed in a vertical direction so that a channel length of a transistor can be maintained in spite of a reduction in the design rule. Namely, although a channel width in a vertical direction is short, the doping density can be reduced as much as a channel length in the vertical direction is secured, thereby preventing the refresh characteristic from being deteriorated.

In addition, the higher integration of a semiconductor device, the shorter a distance between a word line and a bit line connected to a cell transistor. Owing to this, parasitic capacitance is increased to deteriorate an operation margin of a sense amplifier amplifying data transferred through the bit line. The parasitic capacitance also has a bad influence upon the operation reliability of a semiconductor device.

To solve such a problem, a buried word line structure has been proposed to reduce parasitic capacitance between a bit line and a word line. In the buried word line structure, the word line is formed in only a recess and not at an upper portion of a semiconductor substrate. In the buried word line structure, a conductive material is formed in the recess formed in the semiconductor substrate, and an upper portion of the conductive material is covered with an insulating layer to bury the word line in the semiconductor substrate. Accordingly, an electric isolation with the bit line formed on the semiconductor substrate on which source/drain are disposed can be clearly achieved.

As described above, in the buried word line structure, the area in which the source/drain junction and the word line are overlapped exists and Gate Induced Drain Leakage (GIDL) is generated in such an overlapped area. If the GIDL is large, the stored electric charge is discharged, and memory retention characteristics are degraded.

BRIEF SUMMARY OF THE INVENTION

Embodiments of the present invention are directed to provide a semiconductor device and a method for manufacturing the same.

According to an embodiment of the present invention, a method of manufacturing a semiconductor device includes: forming a recess on a semiconductor substrate; forming a first gate electrode material and a hard mask layer on an entire surface including the recess; etching the hard mask layer and the first gate electrode material to form the first gate electrode pattern on a lower portion of inside of the recess; forming a second gate electrode material on an entire surface including the recess; and etching the second gate electrode material and separating the second gate electrode material.

The first gate electrode material includes one material selected from among TiN, TaN, Ti, Ta, Mo, Al and the combination thereof. The hard mask layer includes one selected from among a polysilicon layer, an oxide layer, a photo resist film, a carbon layer and the combination thereof. The second gate electrode material is formed with a laminated structure of one material selected from among TiN, TaN, Ti, Ta, Mo, Al and the combination thereof and tungsten W. The tungsten W layer is more widely deposited in an upper portion of the recess than in a lower portion of the recess. A thickness of the first and the second gate electrode material of the lower portion of the recess is formed to be more thicker than a thickness of the second gate electrode material of the upper portion of the recess. Separating the second gate electrode material uses an etch back process.

According to another embodiment of the present invention, a method of manufacturing a semiconductor device includes: forming a recess on a semiconductor substrate; forming a first gate electrode material on an entire surface including the recess; etching the first gate electrode material to form the first gate electrode pattern on a lower portion of inside of the recess; forming a second gate electrode material within the recess; and etching the second gate electrode material and separating the second gate electrode material between the recess.

The first and the second gate electrode material are formed of one material selected from among TiN, TaN, Ti, Ta, Mo, Al and the combination thereof, and tungsten W. Separating the second gate electrode material uses an etch back process.

According to an embodiment of the present invention, a semiconductor device includes: a recess formed on a semiconductor substrate; a first gate electrode material formed on a lower portion of inside of the recess; a second gate electrode material buried within the recess; and a gate electrode formed by separating the second gate electrode material.

The first and the second gate electrode material are formed with a laminated structure of one material selected from among TiN, TaN, Ti, Ta, Mo, Al and the combination thereof and tungsten W. The tungsten W layer is more widely deposited in an upper portion of the recess than in a lower portion of the recess.

DESCRIPTION OF EMBODIMENTS

Hereinafter, an embodiment of the present invention is illustrated in detail with reference to attached drawings.

FIGS. 1a to 1e are cross-sectional views showing a semiconductor device and manufacturing method according to an embodiment of the present invention.

Figure 1A:
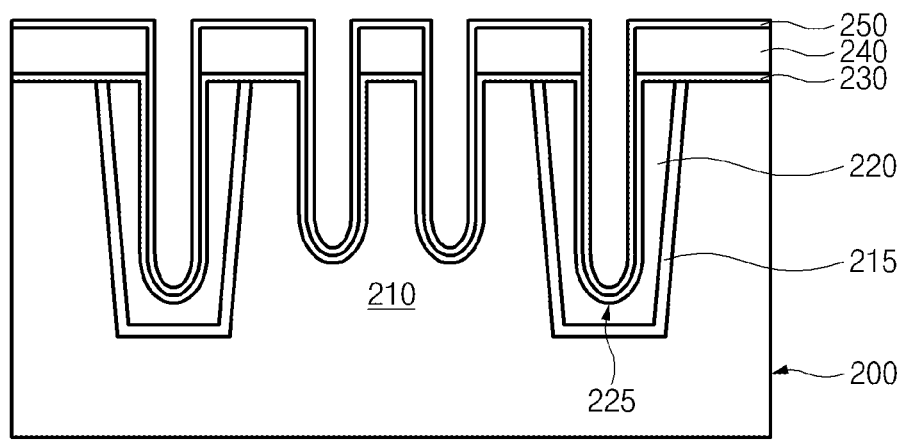
FIGS. 1a to 1e are cross-sectional views showing a semiconductor device and manufacturing method according to an embodiment of the present invention.

Referring to FIG. 1a, after a photo resist film is formed on a semiconductor substrate 200, a photo resist pattern (not shown) is formed by an exposure and development process using a trench mask. The semiconductor substrate 200 is etched with the photo resist pattern as a mask to form a trench (not shown). An element isolation film 220 defining an active area 210 is formed by filling a pad nitride layer 215 and an insulating layer (not shown) into the trench.

After the photo resist film is formed over the entire surface including the active area 210 and the element isolation film 220, a photo resist pattern (not shown) is formed by an exposure and development process using a recess mask. Then, the active area 210 and the element isolation film 220 are etched with the photo resist pattern as a mask to form a recess 225.

After a gate insulating layer 230 and a hard mask layer nitride pattern 240 are formed over the entire surface including the recess 225, a first gate electrode material 250 is formed over the entire surface including the recess 225 and the hard mask layer nitride pattern 240. At this time, it is preferable that the first gate electrode material 250 is formed of any of TiN, TaN, Ti, Ta, Mo, Al and combinations thereof.

Figure 1B:
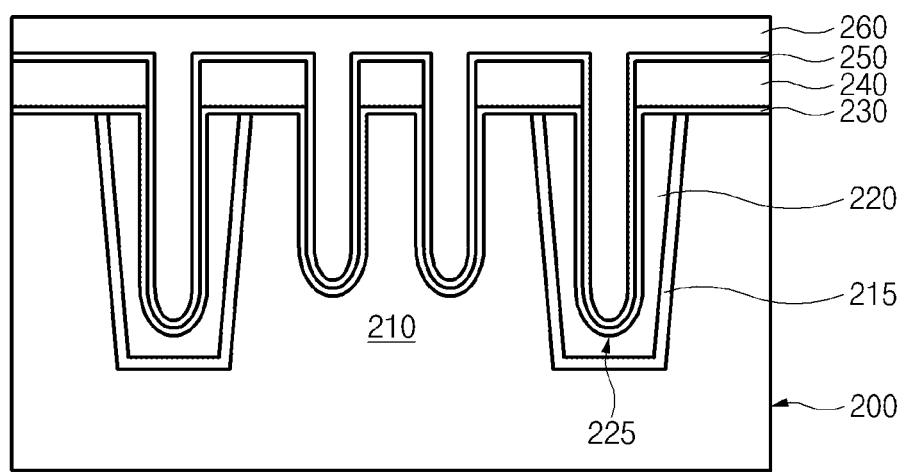

Referring to FIG. 1b, a polysilicon layer 260 used as a hard mask layer is formed over the entire surface including the first gate electrode material 250. At this time, the hard mask layer can be formed of any of a polysilicon layer, an oxide layer, a photo resist layer, a carbon layer and combinations thereof.

Figure 1C:
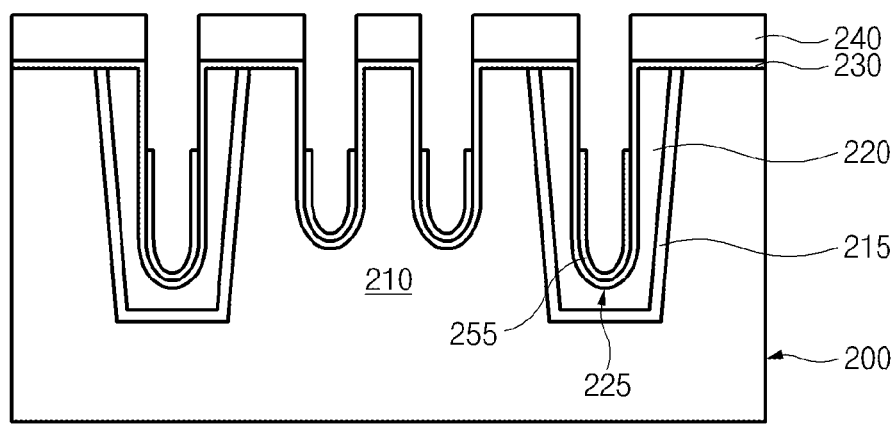

Referring to FIG. 1c, after the polysilicon layer 260 and the first gate electrode material 250 are etched-back, the polysilicon layer 260 is completely removed such that the first gate electrode pattern 255 remains on a lower portion of the recess 225.

Here, since the first gate electrode pattern 255 remains at a lower part in the recess 225, if additional gate electrode material (nitride titanium TiN layer and tungsten W layer) is deposited over the first gate electrode pattern 255 in a subsequent process, the lower portion of the gate electrode is formed thicker than an upper portion of the gate electrode. This allows the work function of the gate electrode to be maintained at a high level.

Figure 1D:
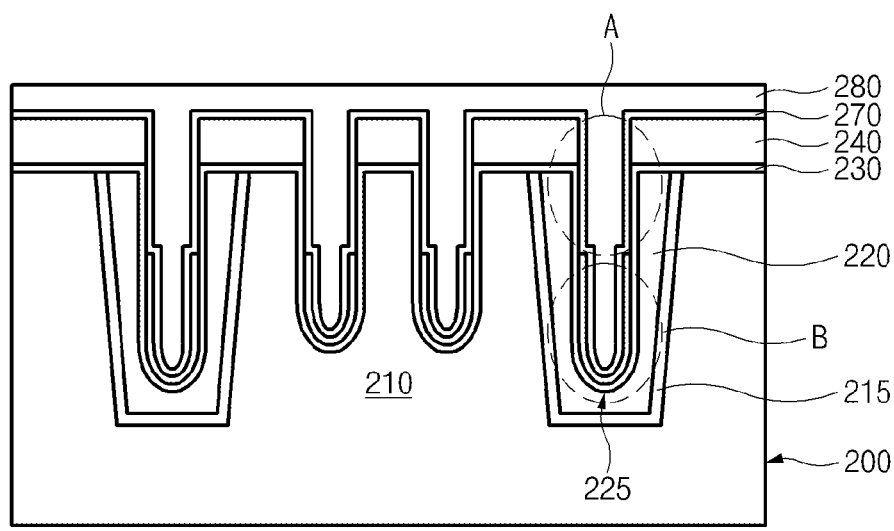

Referring to FIG. 1d, a second and a third gate electrode material 270, 280 are deposited over the first gate electrode 255 in the recess 225. At this time, it is preferable that the second gate electrode material 270 is formed in a laminated type and formed of any of TiN, TaN, Ti, Ta, Mo, Al and combinations thereof, and the third gate electrode 280 is formed of tungsten W. Here, since the upper portion (A area) of the third gate electrode 280 (tungsten) is more widely formed than the lower portion (B area), the upper portion (A area) of the third gate electrode 280 has resistance lower than the lower portion (B area).

Figure 1E:
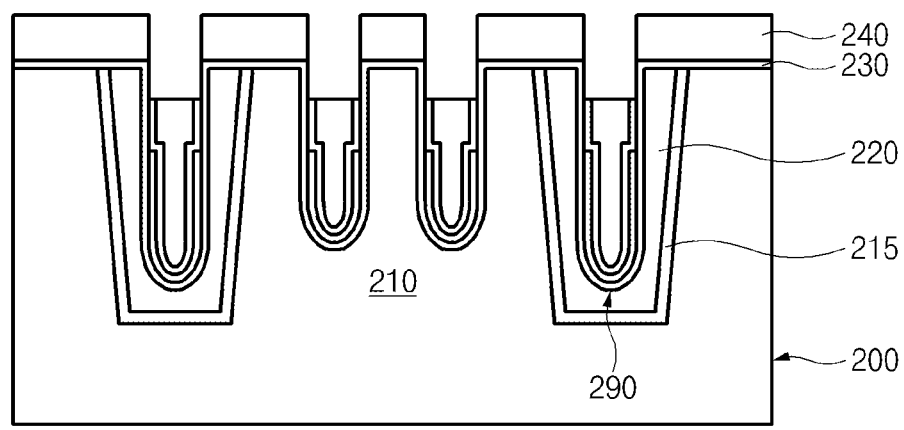

Referring to FIG. 1e, the second and the third gate electrode materials 270, 280 are subject to an etch-back process to form a buried gate pattern 290. The buried gate pattern 290 includes a lower gate pattern and an upper gate pattern. The lower gate pattern includes a stack of the first, the second and the third gate electrodes 255, 270 and 280. The upper gate pattern includes a stack of the second and the third gate electrodes 270 and 280. The first and the second gate electrodes 255 and 270 can be formed of the same material.

FIGS. 2a to 2d are cross-sectional views showing a semiconductor device and manufacturing method according to another embodiment of the present invention.

Figure 2A:
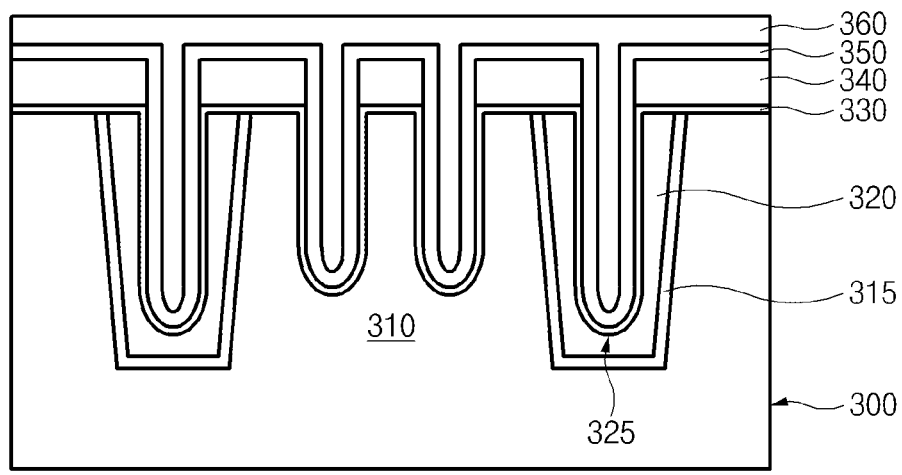
FIGS. 2a to 2d are cross-sectional views showing a semiconductor device and manufacturing method according to another embodiment of the present invention.

Referring to FIG. 2a, after the photo resist film is formed on a semiconductor substrate 300, a photo resist pattern (not shown) is formed by an exposure and development process using a trench mask. The semiconductor substrate 300 is etched with the photo resist pattern as a mask to form a trench (not shown). A pad nitride layer 315 and an insulating layer (not shown) are buried in the trench such that an element isolation film 320 defining an active area 310 is formed.

Next, after the photo resist film is formed on the entire surface including the active area 310 and the element isolation film 320, a photo resist pattern (not shown) is formed by an exposure and development process using a recess mask. The active area 310 and the element isolation film 320 are etched with the photo resist pattern as a mask, so that a recess 325 is formed.

After a gate insulating layer 330 and a hard mask layer nitride pattern 340 are formed on the entire surface including the recess 325, a first gate electrode layer 350 is laminated over the inner surface of the recess 325 and over the hard mask layer nitride pattern 340. Then, a second gate electrode layer 360 is formed over the first gate electrode layer 350 so as to fill the recess 325. At this time, it is preferable that the first gate electrode layer 350 is formed in a laminated structure using any of TiN, TaN, Ti, Ta, Mo, Al and combinations thereof, and the second gate electrode layer 350 is formed of tungsten W.

Figure 2B:
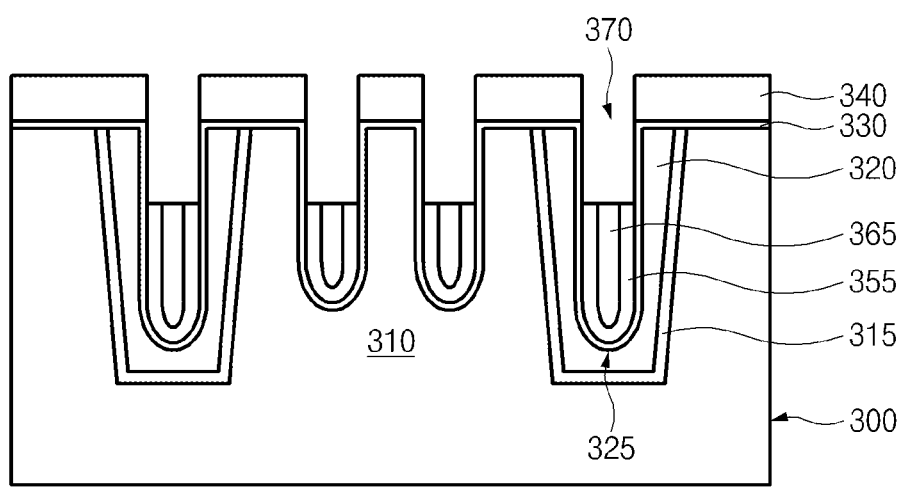

Referring to FIG. 2b, until the hard mask layer nitride pattern 340 is exposed, the first and second gate electrode layers 350, 360 are etched-back 370 to form a first gate electrode pattern 355 and a second gate electrode pattern 365. The first gate electrode pattern 355 and the second gate electrode pattern 365 form a lower buried gate pattern.

Figure 2C:
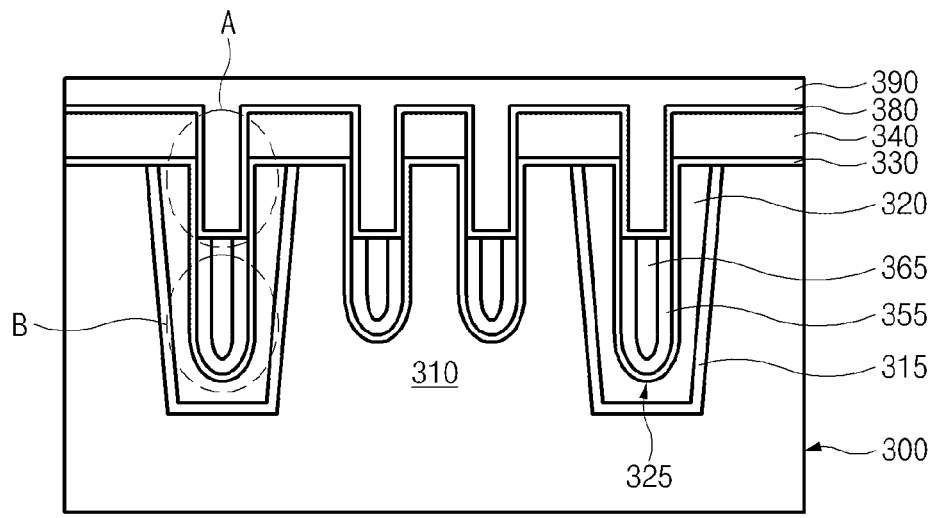

Referring to FIG. 2c, a third gate electrode layer 380, and a fourth gate electrode layer 390 are formed over the lower buried gate pattern in the recess 325. It is preferable that the third gate electrode layer 380 is formed in a laminated structure using any of TiN, TaN, Ti, Ta, Mo, Al and a combination thereof, and the fourth gate electrode layer 390 is formed of material with a higher conductivity than the third gate electrode layer 380, for example, tungsten W.

Here, the fourth gate electrode layer 390 (tungsten layer) in an upper buried gate pattern (A area) is more widely formed than the second gate electrode pattern 365 in a lower buried gate pattern (B area). Since the fourth gate electrode layer 390 has higher conductivity than the third gate electrode layer 380, the second gate electrode pattern 365 has higher conductivity than the first gate electrode pattern 355, and the fourth gate electrode layer 390 is formed wider than the second gate electrode pattern 365, the resistance of the upper buried gate pattern (A area) is lower than the lower buried gate pattern (B area).

Figure 2D:
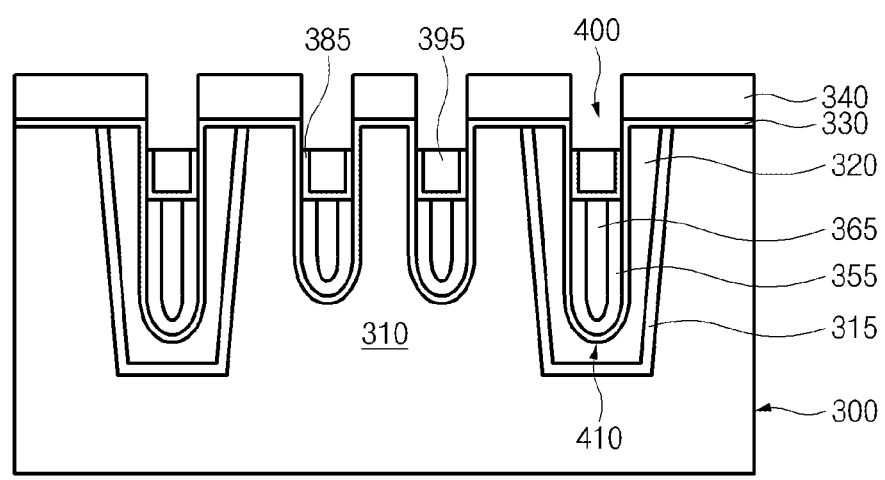

Referring to FIG. 2d, the third and the fourth gate electrode layer 380, 390 are etched-back 400 to form a third gate electrode pattern 385 and a fourth gate electrode pattern 395. The third and the fourth gate electrode patterns 385 and 395 forms the upper buried gate pattern (A area). The third gate electrode pattern 385 can be formed of the same material as the first gate electrode pattern 355, and the fourth gate electrode pattern 395 can be formed of the same material as the second gate electrode pattern 365. However, materials forming the first through the fourth gate electrode patterns are not specifically limited as long as the upper gate pattern including the third and the fourth gate electrode patterns 385 and 395 have higher conductivity than the lower buried gate pattern including the first and the second gate electrode patterns 355 and 365.

As described above, the present invention forms the first gate electrode pattern 355 with relatively lower conductivity (TiN) has a lower buried gate pattern thicker than the third gate electrode pattern 385 (TiN). On the other hand, in the upper buried gate pattern, the fourth gate electrode pattern 395 with relatively higher conductivity (W) is formed thicker than the second gate electrode pattern 365 of the lower buried gate pattern. Accordingly, the resistance of the gate electrode is reduced, and work function of a buried gate can be maintained at a high level.

The above embodiments of the present invention are illustrative and not limitative. Various alternatives and equivalents are possible. The invention is not limited by the type of deposition, etching polishing, and patterning steps described herein. Nor is the invention limited to any specific type of semiconductor device. For example, the present invention may be implemented in a dynamic random access memory (DRAM) device or non volatile memory device. Other additions, subtractions, or modifications are obvious in view of the present disclosure and are intended to fall within the scope of the appended claims.

What is claimed is:

1. A semiconductor device, comprising:
   a recess formed on a semiconductor substrate;
   a first and a second gate electrode pattern coating a lower portion of the recess, the first and the second gate electrode pattern being conductive material; and
   a third and a fourth gate electrode pattern formed within the recess,
   wherein the fourth gate electrode pattern is formed wider than the second gate electrode pattern.

2. The semiconductor device of claim 1, wherein the first and the second gate electrode pattern include any selected from the group consisting of TiN, TaN, Ti, Ta, Mo, Al and a combination thereof, and
   wherein the primarily gate electrode material includes tungsten W.

* * * * *